(12) United States Patent
Cao et al.

(10) Patent No.: US 11,817,913 B1
(45) Date of Patent: Nov. 14, 2023

(54) CORRECTING ERROR VECTOR MAGNITUDE MEASUREMENTS

(71) Applicant: LitePoint Corporation, San Diego, CA (US)

(72) Inventors: Chen Cao, Shanghai (CN); Christian Volf Olgaard, Saratoga, CA (US); Ruizu Wang, Santa Clara, CA (US); Qingjie Lu, Shanghai (CN)

(73) Assignee: LITEPOINT CORPORATION, San Jose, CA (US)

( * ) Notice: Subject to any disclaimer, the term of this patent is extended or adjusted under 35 U.S.C. 154(b) by 0 days.

(21) Appl. No.: 17/746,230

(22) Filed: May 17, 2022

(30) Foreign Application Priority Data

May 11, 2022 (CN) .......................... 202210508697.8

(51) Int. Cl.
*H04B 17/00* (2015.01)
(52) U.S. Cl.
CPC .............................. *H04B 17/0085* (2013.01)
(58) Field of Classification Search
CPC ................................................. H04B 17/0085
USPC ................................ 455/67.14; 375/224–228
See application file for complete search history.

(56) References Cited

U.S. PATENT DOCUMENTS

| | | | |
|---|---|---|---|
| 4,965,761 A | 10/1990 | Schlunt | |
| 5,412,325 A | 5/1995 | Meyers | |
| 6,268,735 B1 | 7/2001 | Craig et al. | |
| 6,484,124 B1 * | 11/2002 | MacMullen | G01R 29/26 702/182 |
| 6,784,819 B2 | 8/2004 | Chow | |
| 6,979,993 B2 | 12/2005 | Kurosawa | |
| 7,343,558 B2 | 3/2008 | Kadota | |
| 7,719,451 B2 | 5/2010 | Tamba | |
| 7,990,418 B2 | 8/2011 | Liu | |
| 8,064,550 B2 | 11/2011 | Chrabich et al. | |

(Continued)

FOREIGN PATENT DOCUMENTS

| | | |
|---|---|---|
| EP | 1260822 A2 | 11/2002 |
| JP | H07-270464 A | 10/1995 |

(Continued)

OTHER PUBLICATIONS

M. Sampietro, L. Fasoli, and G Ferrari, "Spectrum analyzer with noise reduction by cross—correlation technique on two channels", vol. 70, No. 5, May 1999.

(Continued)

*Primary Examiner* — Don N Vo
(74) *Attorney, Agent, or Firm* — Burns & Levinson LLP

(57) ABSTRACT

An example process determines a first error vector magnitude (EVM) of a signal output by a device under test (DUT). The process includes adding attenuation on a signal path between the DUT and a vector signal analyzer (VSA), where the attenuation is changeable: measuring, at the VSA, at least two second EVMs for different values of attenuation of the signal output by the DUT, where the at least two second EVMs are corrupted by noise from the VSA, and where each of the at least two second EVMs is based on two or more measurements; and determining the first EVM based on a linear relationship that is based on the first EVM, the at least two second EVMs, and a function based on the attenuation, where the first EVM is without at least some of the noise from the VSA.

17 Claims, 10 Drawing Sheets

(56) References Cited

U.S. PATENT DOCUMENTS

| | | |
|---|---|---|
| 8,218,696 B2 | 7/2012 | Rashid et al. |
| 8,255,183 B1 | 8/2012 | Husted et al. |
| 8,680,852 B2 | 3/2014 | Daly et al. |
| 9,442,148 B2 | 9/2016 | Chow |
| 10,756,829 B1 * | 8/2020 | Therrien .................... G06F 9/52 |
| 10,841,019 B1 * | 11/2020 | Shah ................ G01R 31/31708 |
| 2004/0001017 A1 | 1/2004 | Chow |
| 2004/0100244 A1 | 5/2004 | Kurosawa |
| 2005/0137814 A1 | 6/2005 | Kelly et al. |
| 2005/0238094 A1 | 10/2005 | Bessho et al. |
| 2007/0225927 A1 | 9/2007 | Bessho et al. |
| 2008/0036865 A1 | 2/2008 | Liu |
| 2008/0219386 A1 | 9/2008 | Chrabieh et al. |
| 2009/0082981 A1 | 3/2009 | Muto |
| 2010/0283902 A1 | 11/2010 | Rashid et al. |
| 2010/0327860 A1 | 12/2010 | Daly et al. |
| 2011/0309842 A1 | 12/2011 | Behzad |
| 2012/0121000 A1 | 5/2012 | Olgaard et al. |
| 2014/0313071 A1 * | 10/2014 | McCorkle ............. G01S 13/106 342/202 |
| 2015/0369898 A1 * | 12/2015 | Torin ..................... G01R 25/00 324/750.02 |
| 2016/0072594 A1 | 3/2016 | Yuan et al. |
| 2020/0136732 A1 | 4/2020 | Verma et al. |
| 2022/0271879 A1 * | 8/2022 | Mohindra ................ H04L 1/24 |

FOREIGN PATENT DOCUMENTS

| | | |
|---|---|---|
| JP | 10-082812 A | 3/1998 |
| JP | 2005-184407 A | 7/2005 |
| JP | 2005-308511 A | 11/2005 |
| JP | 2007-295257 A | 11/2007 |
| JP | 04-050783 B1 | 2/2008 |
| JP | 4060470 B2 | 3/2008 |
| JP | 2008-122079 A | 5/2008 |
| JP | 4176479 B2 | 11/2008 |
| TW | 201008141 A | 2/2010 |
| WO | 2016167909 A1 | 10/2016 |

OTHER PUBLICATIONS

Alink et al., "A 50MHz-to-1.5GHz Cross—Correlation CMOS Spectrum Analyzer for Cognitive Radio with 89dB SFDR in IMHz RBW," IEEE (2010), 6 pgs.

International Search Report and Written Opinion in Application No. PCT/US2023/020704 dated Aug. 25, 2023, 11 pages.

\* cited by examiner

CORRECTING ERROR VECTOR MAGNITUDE MEASUREMENTS

CROSS-REFERENCE TO RELATED APPLICATION

This application claims priority to Chinese Patent Application No. 202210508697.8, which was filed on May 11, 2022. Chinese Patent Application No. 202210508697.8 is incorporated herein by reference.

TECHNICAL FIELD

This specification describes examples of systems for correcting error vector magnitude measurements.

BACKGROUND

Test systems are configured to test the operation of electronic devices. Testing may include sending signals to a device and determining how the device reacted to those signals based on its response. For example, testing may include sending test signals to a device, such as an integrated circuit (IC), and receiving radio frequency (RF) signals back from the device. The RF signals are processed to determine whether the device is performing acceptably. An error vector magnitude (EVM) is a measure of a quality of the signal received from the DUT.

SUMMARY

Example processes determine a first error vector magnitude (EVM) of a signal output by a device under test (DUT). The processes include adding attenuation on a signal path between the DUT and a vector signal analyzer (VSA), where the attenuation is changeable; measuring, at the VSA, at least two second EVMs for different values of attenuation of the signal output by the DUT, where the at least two second EVMs are corrupted by noise from the VSA, and where each of the at least two second EVMs is based on two or more measurements; and determining the first EVM based on a linear relationship that is based on the first EVM, the at least two second EVMs, and a function based on the attenuation, where the first EVM is without at least some of the noise from the VSA. The processes may include one or more of the following example features, either alone or in combination.

The processes may include determining the noise from the VSA based on a slope of a line fit to the at least two second EVMs. The processes may include keeping an output signal from the DUT constant while changing the attenuation using an attenuator to produce an input signal to the VSA. For each different value of the attenuation, the processes may include measuring, at the VSA, one or more additional second EVMs, where each of the one or more additional second EVMs is based on two or more measurements; and determining the first EVM based on a linear relationship that is based on the first EVM, the at least two second EVMs and the one or more additional second EVMs, and the function based on the attenuation.

The processes may include varying a reference level signal to the VSA corresponding to a maximum signal that the VSA can handle without introducing significant distortion into the signal output by the DUT; and repeating adding, measuring, and determining for each variation of the input signal to produce a different first EVM. The linear relationship may include an intersection of a line passing through values based on the at least two second EVMs and a zero value of the function based on attenuation. The linear relationship may include a slope of a line passing through values based on the at least two second EVMs. Determining the first EVM based on the linear relationship may include extrapolating the line based on the slope to a zero value of the function based on attenuation. The function based on attenuation may include an inverse of a square of the attenuation.

Compression distortion is a function of gain in the VSA. The processes may include reducing a gain of the VSA to reduce added distortion in the first EVM. An optimized first EVM may be determined at a VSA gain that substantially removes compression distortion from the VSA. By reducing VSA gain, a compression distortion contribution of the VSA to the first EVM may be reduced.

The processes may include obtaining a value for the attenuation based on varying a gain of the VSA. Obtaining the value for the attenuation may include obtaining EVM measurements based on different gain settings of the VSA corresponding to different noise contributions of the VSA and different attenuation values; and identifying, based on the EVM measurements, one of the attenuation values where the EVM measurements are substantially same. If the EVM measurements do not change, the one of the attenuation values is the actual attention in the test channel. If an EVM measurement decreases in response to a change in an attenuation value, then a value of the attenuation may be decreased to obtain additional EVM measurements. If an EVM increases in response to a change in an attenuation value, then the value of the attenuation is increased to obtain additional EVM measurements.

The processes may be performed on automatic test equipment (ATE) comprising at least one processing device and memory to store instructions that are executable by the at least one processing device, where the VSA is or, is not, part of the ATE. The processes may be performed using an attenuator between the ATE and the DUT. The processes may be performed using an attenuator that is part of the ATE.

Example processes compensate for an effect of phase noise on a first error vector magnitude (EVM) of a signal output by a device under test (DUT). The processes include estimating an EVM contribution from phase noise of a vector signal analyzer (VSA); and removing the EVM contribution from phase noise from the first EVM. The processes may include one or more of the following example features, either alone or in combination.

Estimating the phase noise may include obtaining a first EVM contribution from phase noise based on measurements obtained from a first VSA having a common local oscillator with a vector signal generator (VSG); obtaining a second EVM contribution from phase noise based on measurements obtained from a second VSA having an independent or different local oscillator from a VSG, where the second VSA has equivalent performance and signal level as the first VSA; and estimating the EVM contribution from phase noise based on a difference between the first EVM contribution and the second EVM contribution. The first VSA and the second VSA may be different. The first VSA and the second VSA may be the same.

Any two or more of the features described in this specification, including in this summary section, may be combined to form implementations not specifically described in this specification.

The various systems described herein, or portions thereof, may be implemented, at least in part, via a computer program product that includes instructions that are stored on one or more non-transitory machine-readable storage media and that are executable on one or more processing devices (e.g., microprocessor(s), application-specified integrated circuit(s), programmed logic such as field programmable gate array(s), or the like). The processes described herein, or portions thereof, may be implemented as an apparatus, method, or system that may include one or more processing devices and computer memory to store executable instructions to implement control of the stated functions. The devices, systems, processes, and/or components described herein may be configured, for example, through design, construction, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein example implementations of techniques, processes, and test systems, such as automatic test equipment (ATE) that are configured to correct error vector magnitude (EVM) measurements. An EVM is a measure of how accurately a device under test (DUT) transmits symbols within a constellation. An example constellation diagram includes a graphical representations of symbols transmitted using radio frequency (RF) signals. In this regard, digitally-modulated signals encode information using a sinusoidal carrier signal by mixing a sinusoidal carrier wave with a data signal. The data signal modifies the amplitude, the phase angle, or both the amplitude and the phase angle of the carrier signal to produce a modulated signal. The modulated signal includes a combination of amplitude and phase values. This combination of amplitude and phase values may represent symbols that represent one or more bits of data. These symbols correspond to points on a constellation diagram. The location of each point on the constellation diagram is based on the amplitude and the phase angle associated with its corresponding symbol.

Figure 1:
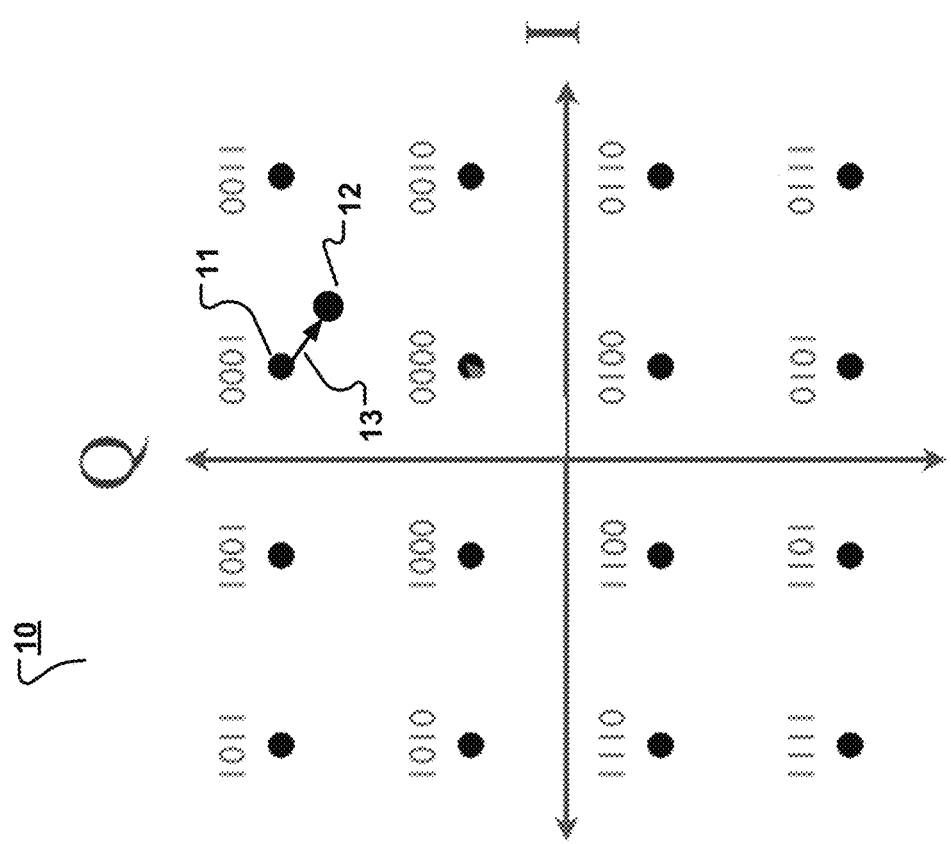
FIG. 1 is a graph showing an example error vector.

In the example constellation diagram 10 of FIG. 1, points representing four-bit symbols are arranged on a two-dimensional graph representing an inphase (I) and quadrature (Q) complex plane. In this example, each point represents the ideal location of a symbol within that plane. However, in other examples, each point may represent an estimated location of an ideal point in the plane.

When received data is demodulated, a location of a symbol, such as "0001" represented by the data, is identified on the constellation diagram. In some cases, the location of a symbol represented by the data does not coincide with the location of that symbol on the constellation diagram. For example, a symbol (0001) represented by the data may be located at point 12 on the constellation diagram. The difference between the ideal point 11 for "0001" and the measured point 12 constitutes an error, which may be due to noise in the RF signal upon which the data is based. This error may be determined relative to the closest predetermined point in the constellation diagram. An error vector 13 represents this difference in location between the predetermined and measured points. The magnitude of this vector 13 is the EVM.

EVM measurements may be corrupted, which can adversely affect their accuracy. For example, white noise, compression distortion, and phase noise may reduce the accuracy of an EVM measurement. The example systems, techniques, and processes described herein address white noise, compression distortion, and phase in EVM measurements, which may improve EVM measurement accuracy. The techniques and processes are described in the context of a test system, but are not limited to use with test systems or to use in a testing context.

Figure 2:
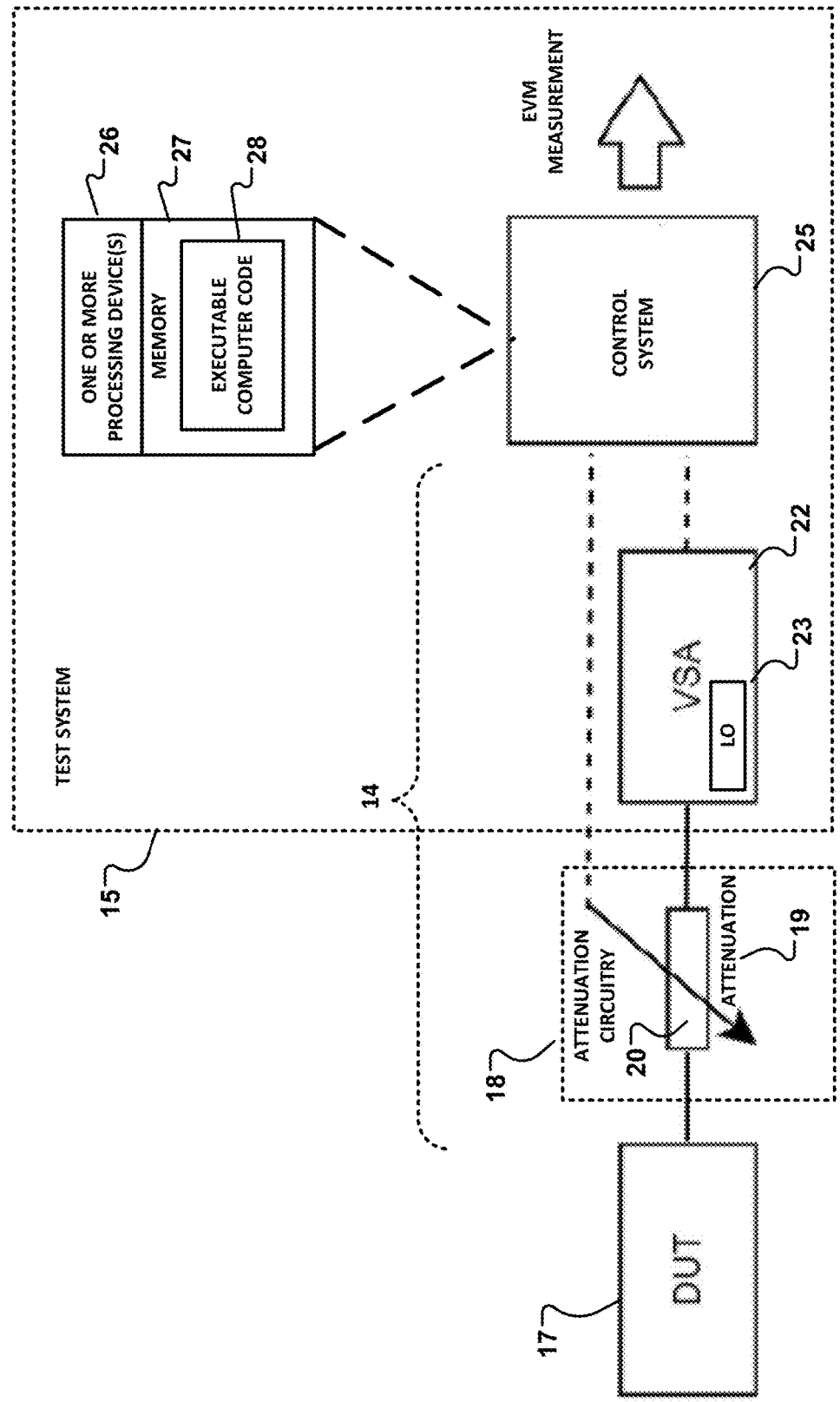
FIG. 2 is a block diagram showing components of an example test channel and showing components of an example test system.

FIG. 2 shows an example test channel ("channel") 14 of an example test system 15 or ATE. As shown in FIG. 2, channel 14 is configured to connect to a DUT 17, such as an 802.11be Wi-Fi device or other type of device configured to transmit RF signals to the test system for analysis. Although an 802.11be Wi-Fi device is mentioned, any type of DUT that outputs RF signals may be tested by the test system.

Channel 14 includes attenuation circuitry 18 configured to provide attenuation 19 to channel 14. Attenuation includes the loss of signal strength in the channel and is typically measured in decibels (dB) or voltage. Examples levels of attenuation include, but are not limited to, 30 db or less, 20 db or less, 15 db or less, 10 db or less, and so forth. The level of attenuation is changeable and the extent of the changes that are permissible may vary based on the type of test system and the type of DUT to be tested by the test system. Attenuation circuity 18 may be or include a tunable attenuator 20 or one or more changeable path loss circuit elements(s). In an example, the tunable attenuator is a stepped attenuator, which provides discrete steps or levels of attenuation, which can be selected by a control system. In some implementations, attenuation circuitry 18 is part of the test system 15. In some implementations, attenuation circuitry 18 not part of test system 15, as shown in FIG. 2.

Channel 14 includes a vector signal analyzer (VSA) 22. An example vector signal analyzer is a hardware device configured to measure a magnitude and phase of an input signal at a frequency that is within a bandwidth of the VSA.

The VSA may also be configured to make in-channel signal measurements, including measuring the EVM of an input signal. In this example, the input signal is a signal from the DUT. The signal from the DUT may be a response to a test stimulus or independent of a test stimulus. VSA 22 may include a local oscillator (LO) 23. An example LO is a hardware device that includes one or more voltage controlled oscillators and/or one or more phase locked loops (PLLs) that are configured to change a frequency of the VSA input signal. In some implementations, the local oscillator is a different component than the VSA. In some implementations, attenuation circuitry 18 is part of the VSA. In any case, the attenuation is configured to occur before gain in the VSA in some implementations.

Test system 15 also includes a control system 25. Control system 25 may include one or more processing devices 26, examples of which are described herein. Control system 25 also includes memory 27 storing computer code or instructions 28 that is/are executable by the one or more processing devices to perform at least part of the processes described herein for correcting EVM measurements.

In this regard, as previously noted, VSA 22 is used to receive and to analyze an input signal from DUT 17 to determine an EVM measurement for the input signal. The EVM determined by the VSA will include both DUT and VSA EVM error contributions. Thus, the EVM determined by the VSA may not be an accurate representation of the signal EVM, particularly when the variance of the error contributions from the DUT and the VSA are comparable. For example, when the error contributions are of the same phase, they can have a cumulative effect on the EVM measured by the VSA.

Part of the error contribution of VSA 22 is referred to as white noise, which may be or include one or more random signals, which may have equal intensity at different frequencies, giving the white noise a substantially constant power spectral density. In some examples, the white noise of VSA 22 will not change when signal power of the received input signal change is within a certain range such as, but not limited to, 6 dB to 3 dB or 2 dB or less). Accordingly, the attenuation added to channel 14, will not substantially affect the white noise of the VSA in that range. However, other errors that may be introduced into the EVM will scale according to the following equation:

$$y = Ax + An_x + n_{VSA,WN}$$

where A represents attenuation introduced by attenuator 20 (0<<A<1), y represents the input signal at VSA 22 received from DUT 17, x represents an ideal version of the input signal from the DUT without error, $n_{VSA,WN}$ represents the error contribution resulting from white noise introduced by VSA 22, and $n_x$ represents errors other than the white noise introduced by VSA 22, including errors introduced by DUT 17 into the input signal. The EVM measurement from the VSA ("the original EVM result") containing all error contributions, can therefore be represented as follows:

$$EVM = \sqrt{\frac{\|n_{VSA,WN} + An_x\|^2}{\|Ax\|^2}}$$

A mathematical expectation, E[ ] of the square of the original EVM result, $EVM^2$, is equivalent to a self-correlation of the original EVM result. $E[EVM^2]$ is represented as follows:

$$E[EVM^2] = \frac{A^2 E[n_x n_x^*] + AE[n_x n_{VSA,WN}^*] + AE[n_x^* n_{VSA,WN}] + E[n_{VSA,WN} n_{VSA,WN}^*]}{A^2 E[xx^*]}$$

Above, $n_x$ and $n_{VSA,WN}$ are two uncorrelated random variables and the "*" represents the complex conjugate of the indicated variable. So, the mathematical expectation, E, of each of these variables is 0, as follows:

$$E[n_x n_{VSA,WN}^*] = 0$$

$$E[n_x^* n_{VSA,WN}] = 0$$

Accordingly, the equation representing $E[EVM^2]$ simplifies to the following:

$$E[EVM^2] = E\left[\frac{1}{xx^*}\right] \frac{A^2 E[n_x n_x^*] + E[n_{VSA,WN} n_{VSA,WN}^*]}{A^2} \quad (1)$$
$$= E\left[\frac{1}{xx^*}\right]\left(E[n_x n_x^*] + \frac{1}{A^2} E[n_{VSA,WN} n_{VSA,WN}^*]\right)$$
$$= E[EVM_x^2] + \frac{1}{A^2} E[EVM_{VSA,WN}^2]$$

Figure 3:
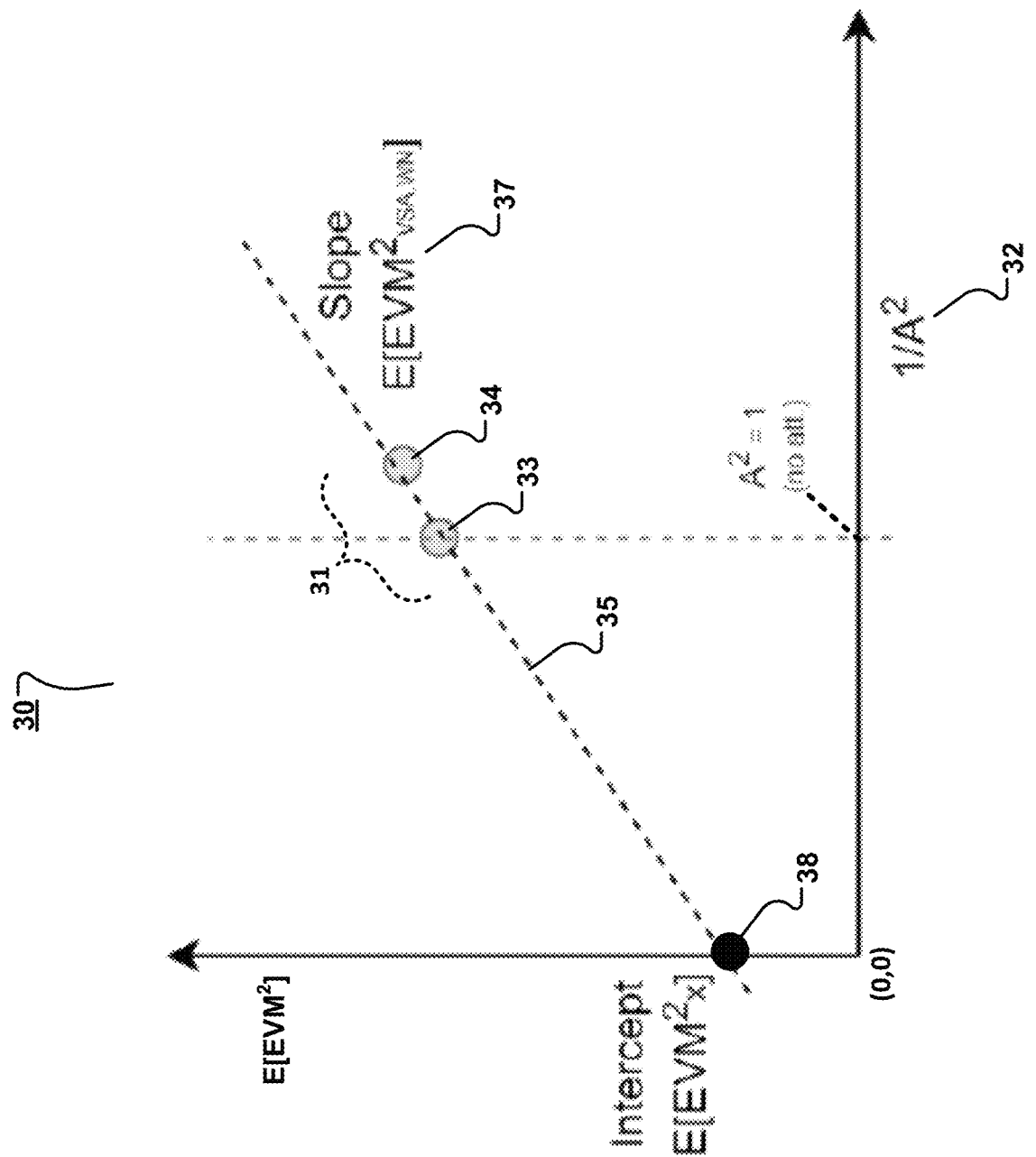
FIG. 3 is a graph showing error vector magnitude information plotted against a function that is based on attenuation.

$E[EVM^2]$ is thus a function of the attenuation, A, introduced into channel 14 by attenuator 20. FIG. 3 shows a graph 30 in which $E[EVM^2]$ values 31 are plotted against a function that is based on the attenuation, A, namely $1/A^2$ 32.

As shown in FIG. 3 $E[EVM^2]$ is a linear function of $1/A^2$. More specifically, graph 30 contains data points 33 and 34, which represent values of $E[EVM^2]$ for different attenuations, A, for a constant input signal. Line 35 thus may be obtained by keeping the signal output from the DUT constant (for example, at a constant power), and varying the attenuation 19 of the channel, which will result in a variation to the signal input to the VSA. The more data points of $E[EVM^2]$ that are obtained, the more accurate the resulting line 35 may be.

In FIG. 3, $EVM_{VSA,WN}$ 37 is the white noise contribution of the VSA. $EVM_x$ 38 is the EVM measured by the VSA with the white noise contribution to the EVM from the VSA removed. The expectation $E[EVM_x^2]$ for $EVM_x$ is the zero-intercept 38 of line 35 and the expectation $E[EVM_{VSA,WN}^2]$ for $EVM_{VSA,WN}$ is the slope 37 of line 35. Accordingly, once a graph like that shown in FIG. 3 is determined, values for $EVM_{VSA,WN}$ and $EVM_x$, may be determined mathematically based on $E[EVM_{VSA,WN}^2]$ and $E[EVM_x^2]$, respectively. E[ ] is the expectation of a random variable. In an example implementation, it is obtained by averaging. In particular, the processes described herein determine $(E[EVM^2])^{1/2}$ as the EVM. That is, the "EVM" determined is the square root of the expectation of instance $EVM^2$ for simplicity, as a single instance may not be used because of variations in EVM values that may occur. Thus, the EVM determined in the example implementations described herein is equivalent to $(E[EVM^2])^{1/2}$.

Figure 4:
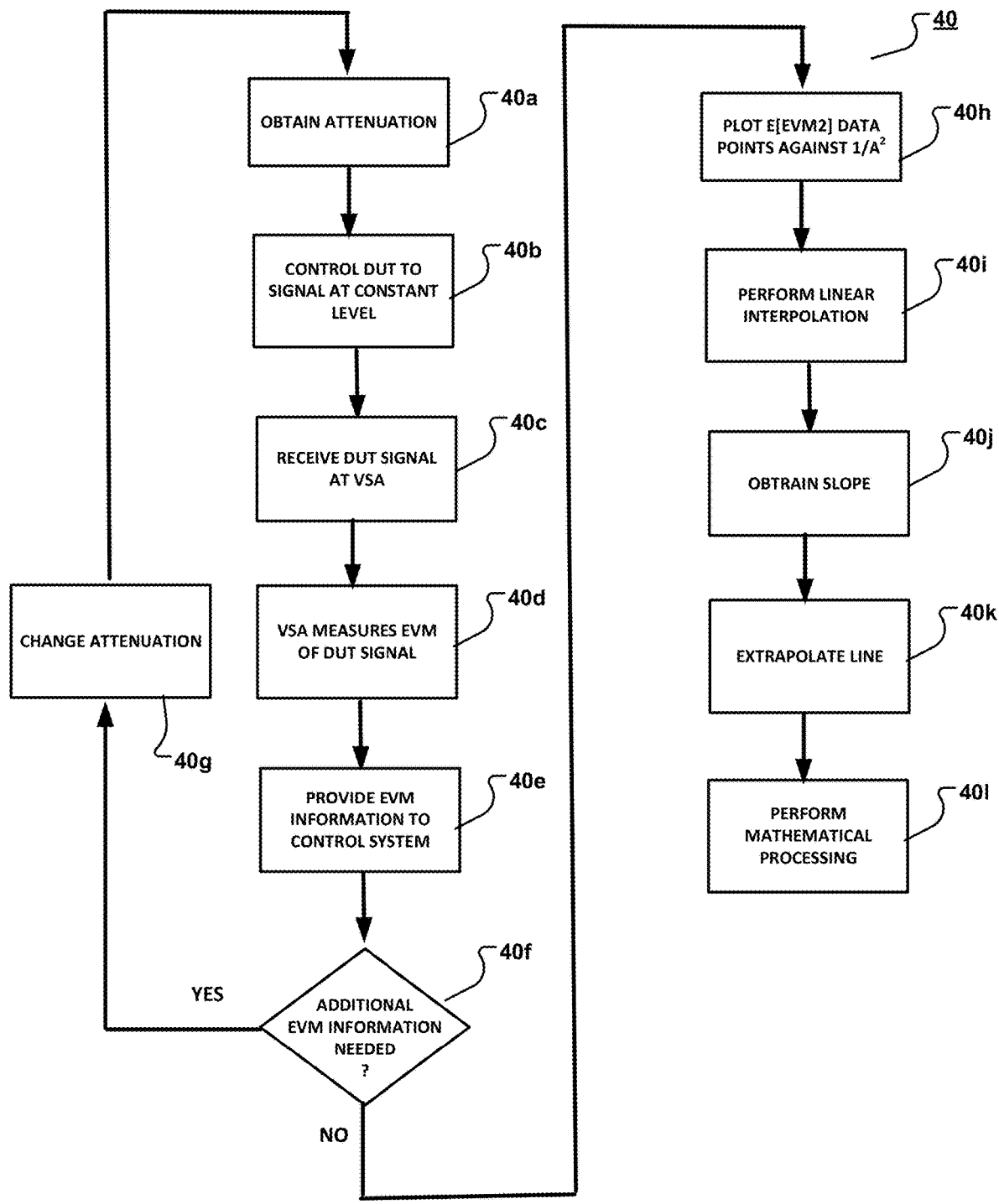
FIG. 4 is a flowchart showing an example process for identifying and removing white noise from an error vector magnitude measurement.

FIG. 4 is a flowchart showing an example process 40 for obtaining $EVM_{VSA,WN}$ and $EVM_x$. Process 40 includes obtaining (40a) an attenuation on the signal path/channel 14 between DUT 17 and VSA 22. For example, attenuator 20 may be controlled by the control system to set its initial attenuation level, for example between 0 (maximum attenuation) and 1 (no attenuation). The attenuation value obtained (40a) may be the attenuation set by the control system, or the attenuation value obtained (40a) may be an attenuation determined using process 50 described below with respect to FIG. 6.

DUT 17 is controlled (40b) by the control system to output a signal at a constant level, such as a constant power. This signal from the DUT signal is input to, and received (40c) by, VSA 22. VSA 22 measures (40d) the EVM of this input signal to obtain an original EVM result (that is, the EVM of the input signal without the VSA white noise contribution removed). The VSA corrupts the EVMs by introducing white noise into the EVMs, as described previously. The measurement of the signal's EVM may be based on at least two (or two or more) EVM measurements of the same signal performed by the VSA. E[EVM$^2$] may be based on an average of the at least two EVM measurements or other processing performed on the EVM measurements. The VSA may provide (40e) EVM information to the control system. For example, individual EVMs may be provided (40e) to the control system to determine the E[EVM$^2$] or the VSA itself may determine E[EVM$^2$] and provide (40e) that to the control system.

Process 40 may then determine (40f) whether additional EVM information—for example, E[EVM$^2$] data points—are needed to construct a graph as in FIG. 3. The number of data points needed may be set in the control system programmatically or by a user. If additional E[EVM$^2$] data points are needed, attenuator 20 is controlled by the control system to change its attenuation (40g), e.g., by 2%, 5%, 10% or more or less from its prior value, or by one or more steps in the case of a stepped attenuator. Operations 40a to 40f are then repeated for the new attenuation to obtain a value for E[EVM$^2$] at the new attenuation. Operations 40a to 40g may be repeated to obtain a requisite number of values for E[EVM$^2$]. For example, two, three, four, five, six, or more EVMs values may be obtained.

After all EVM information—for example, the requisite number of E[EVM$^2$] data points—has been obtained, the control system plots (40h) the values (e.g. points 33 and 34 of FIG. 3) of E[EVM$^2$] against a function based on the attenuation such as 1/A$^2$ 32, as shown in FIG. 3. The control system performs (40i) a linear interpolation to fit a line to these values. The control system obtains (40j) a slope of the resulting line to obtain the value for E[EVM$^2_{VSA,WN}$], which corresponds to the white noise contribution of the VSA. The controller may extrapolate (40k) the line to reach a zero-intercept value of the function, 1/A$^2$, to obtain a value for E[EVM$^2_x$]. E[EVM$^2_x$] corresponds to an EVM measured by the VSA with the white noise contribution to the EVM from the VSA removed. The control system may perform (40l) mathematical processing as described herein to obtain a value for EVM$_{VSA,WN}$ from E[EVM$^2_{VSA,WN}$] and to obtain a value for EVM$_x$ from E[EVM$^2_x$]. For example, the mathematical processing may be obtaining a square root of E[EVM$^2_{VSA,WN}$] and E[EVM$^2_x$] to obtain the EVM values.

Figure 5:
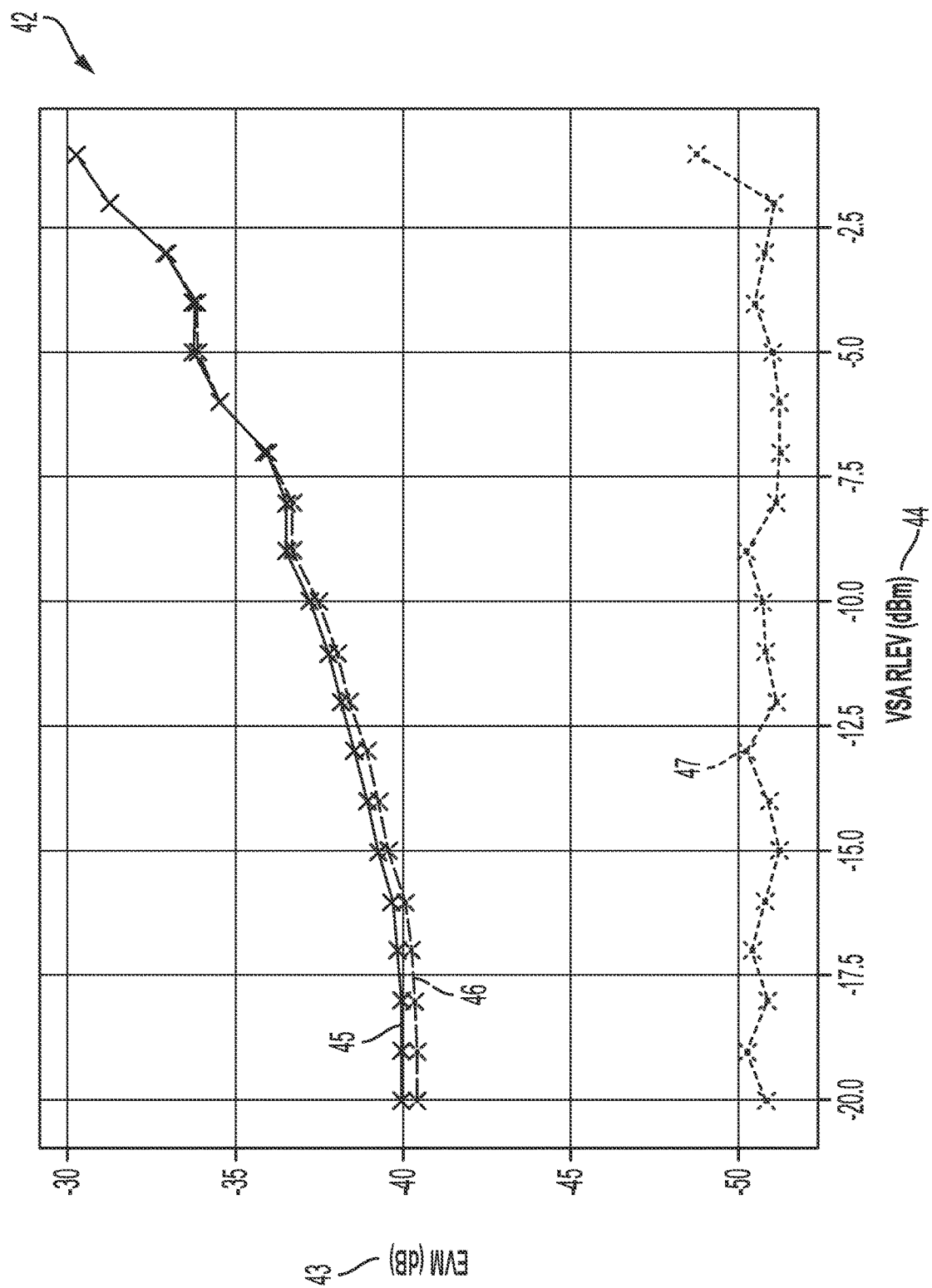
FIG. 5 is a graph showing error vector magnitude information plotted against different vector signal analyzer reference levels.

FIG. 5 is a graph 42 showing various EVM values for an example input signal having a power of −30 dBm (decibels per milliwatt) measured by VSA 22. More specifically, graph 42 shows EVM measurements 43 as a function of different values of the VSA reference level (RLEV) 44 (in dBm), where the VSA reference level is a setting that tells the VSA the expected RMS (root-mean-square) power of all signals entering the VSA, and that configures the VSA for use with such signals. The VSA reference level generally corresponds to the maximum signal that the VSA can analyze without introducing significant distortion into the signal.

In FIG. 5, curve 45 represents the original EVM result for different VSA reference levels; that is, the EVMs of the input signal from the DUT measured by the VSA and containing white noise introduced by the VSA. Curve 46 represents EVM$_{VSA,WN}$ for different VSA reference levels, that is the white noise contribution to the EVM from the VSA. For each value of RLEV, a corresponding value of EVM$_{VSA,WN}$ may be determined in the manner described herein and with respect to FIGS. 2 to 4. Curve 47 represents EVM$_x$ values for different VSA reference levels, that is the EVM measured by the VSA with the white noise contribution to the EVM from the VSA removed. Curve 47 thus also represents to the difference between curves 45 and 46. For each VSA reference level, a corresponding value of EVM$_x$ may be determined in the manner described herein and with respect to FIGS. 2 to 4.

In this particular non-limiting example, by tuning the value of RLEV, the original EVM result can reach −40 dB (decibels). Further reducing the value of RLEV will start compressing the received input signal, so −40 dB is roughly the best original EVM result that can achieved. However, because the VSA white noise error is dominating, the original EVM result does not provide any insight into the true EVM of the DUT signal. By using the techniques described herein, it is possible to separate the original EVM of curve 45 into curves 46 and 47. The result shows the true EVM of the DUT signal is about −51 dB, which is about 10 dB lower than the original EVM result of curve 45.

To produce the graphs shown in FIG. 5, the control system varies the VSA reference level input to the VSA and performs operations 40a to 40l of FIG. 4 for each of the VSA reference level inputs. The control system may perform processing essentially to subtract EVM$_{VSA,WN}$ (curve 46, FIG. 5) from the EVM signal (curve 45, FIG. 5) corrupted by white noise from the VSA to obtain EVM$_x$ (curve 47, FIG. 5). Alternatively, values for EVM$_x$ for curve 47 may be obtained directly in the manner described above.

In addition to white noise, the VSA can introduce a compression error—also referred to as compression distortion or simply "compression"—into an EVM measurement. The VSA white noise and compression distortion are both functions of the gain of the VSA (the "VSA gain"), where the gain is an adjustable setting in the VSA to add power and/or amplitude to a signal. In an example traditional raw EVM measurement, which is designed to minimize overall error in the EVM, the optimization for a VSA gain g is as follows:

$$\min_g E[EVM^2_{WN}](g) + E[EVM^2_{CP}](q) + E[EVM^2_x]$$

$$s.j. E[EVM_{WN}^2](g) \geq k$$

$$E[EVM_{CP}^2](g) \geq 0$$

where CP represents compression distortion. Both white noise and compression EVM functions are monotone functions with g as follows $$\frac{dE[EVM^2_{WN}](g)}{dg} \leq 0,$$

$$\frac{dE[EVM^2_{CP}](g)}{dg} \geq 0$$

This means that the white noise error and the compression distortion are functions of gain in the VSA. The white noise error contribution of the VSA decreases with increased VSA gain, and the compression distortion increases with increased VSA gain. Following the Karush-Kuhn-Tucker (KKT) conditions, minimum compression distortion and white noise reside at:

$$\frac{dE[EVM_{WN}^2](g)}{dg} + \frac{dE[EVM_{CP}^2](g)}{dg} = 0$$

This means that an improved or optimum EVM may be achieved at a point where a changing speed of white noise contribution to the EVM is equal to the compression distortion contribution to the EVM. However, according to the techniques described herein with respect to FIGS. 2 to 5, when the white noise contribution of the VSA to the EVM is removed, the optimization becomes:

$$\min_{g} E[EVM_{CP}^2](g) + E[EVM_x^2]$$

$$s.j. E[EVM_{CP}^2](g) \geq 0$$

In this example, there is a boundary where the compression distortion contribution goes to 0, which corresponds a relatively low VSA gain. For example, VSA gains of −10 db, −20 db, −30 db, or points in between may be considered to be relatively low VSA gains; however, the techniques described herein are not limited to these values. Accordingly, when the white noise contribution is removed using the techniques described herein with respect to FIGS. 2 to 5, the control system may control the VSA gain to be relatively low and thereby reduce the compression distortion contribution to errors in the EVM without substantially increasing white noise. An optimized EVM with reduced or minimal white noise and/or compression distortion contributions from the VSA may thus be obtained by controlling the VSA gain and removing the white noise contribution.

Figure 10:
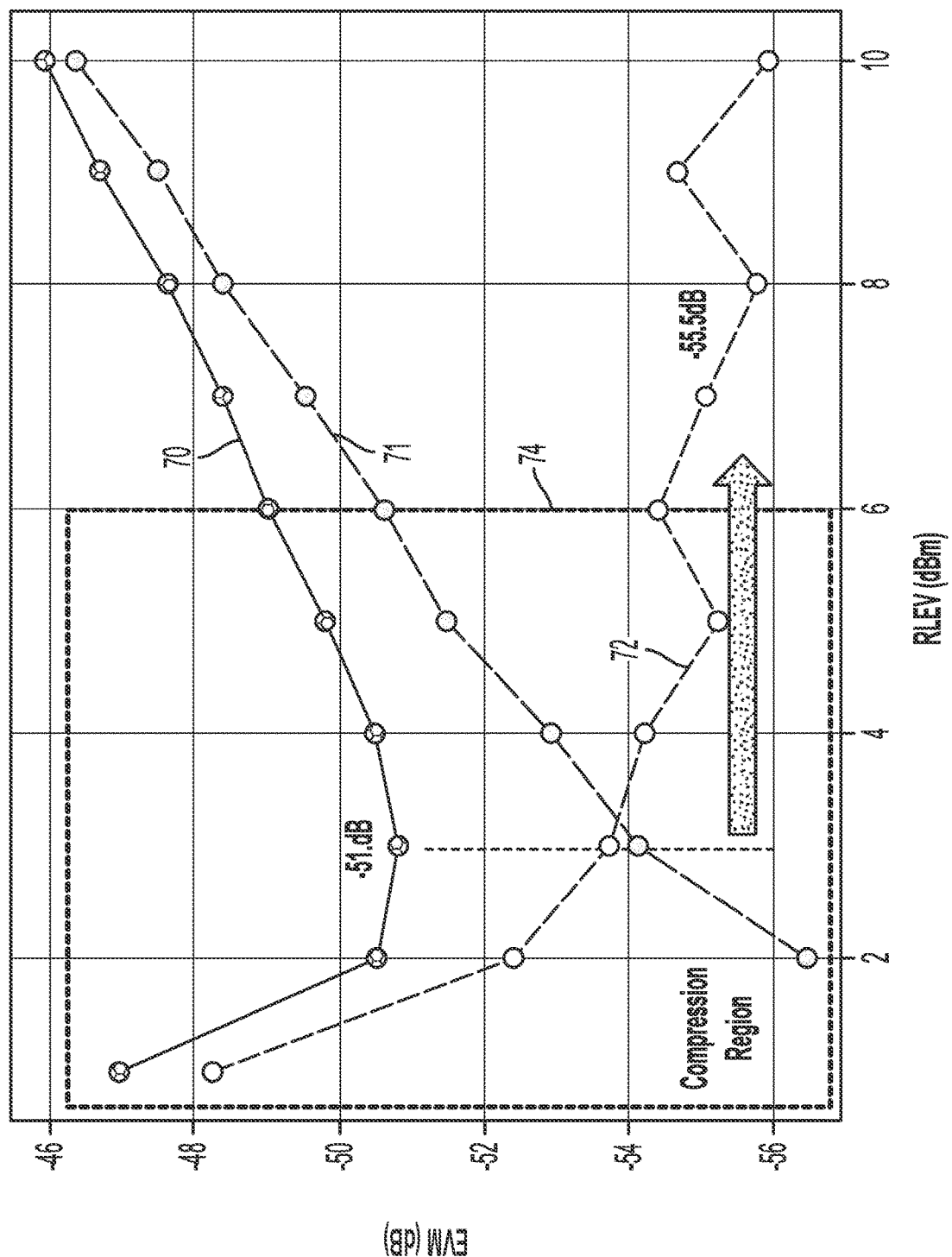
FIG. 10 is a graph showing error vector magnitude information plotted against different vector signal analyzer reference levels and effects of reducing compression distortion.

FIG. 10 is a graph that illustrates removal of compression distortion from an EVM measurement 70 that represents the original EVM result for different VSA reference levels; that is, the EVMs of the input signal from the DUT measured by the VSA and containing white noise and compression noise. Curve 71 represents $EVM_{VSA,WN}$ for different VSA reference levels, that is the white noise contribution to the EVM from the VSA. Curve 72 represents $EVM_x$ values for different VSA reference levels, that is the EVM measured by the VSA with the white noise contribution to the EVM from the VSA removed. Curve 72 thus also represents to the difference between curves 70 and 71. As shown in FIG. 10, region 74 is a region where the VSA gain is greatest, so most compression distortion occurs here. Outside this region, the VSA gain is controlled to be relatively lower, which reduces compression distortion in the compression region and which changes $EVM_x$ from an original averaged value of −51 db to a corrected averaged value of −55 db. The figure show increasing RLEV to obtain about 4 dB less gain; however, the noise compensated EVM (71) can be reduced 2 dB further.

The accuracy of the results provided by techniques described with respect to FIGS. 2 to 5 may be based on the accuracy of the attenuation values used. In an example, attenuator 20 is a stepped attenuator, in which the attenuation values that are to be produced are set in the attenuator by the control system. The actual attenuation values in the test channel, however, may differ from that set by the attenuator. For example, the structure of the test channel and other components may add attenuation or the attenuator's performance may vary based, for example, on temperature. Accordingly, the following techniques may be used to determine the actual attenuation in the test channel. These techniques may be performed by the control system each time the attenuation is changed by the control system (40g, FIG. 4).

The estimated attenuation is defined as the attenuation set in the attenuator by the control system. The relationship between the actual attenuation, Â, and the estimated attenuation, A, is as follows:

$$\widehat{A^2} = \delta A^2$$

where δ is a multiplier that corresponds to the difference between the two. The estimated EVM ($\overline{EVM_x^2}$) caused by δ is based on $EVM_{VSA,Wn}$ (the EVM VSA white noise contribution) and $EVM_x$ (the EVM with the white noise removed) and is represented by the following equation.

$$\overline{EVM_x^2} = EVM_x^2 + \frac{\delta - 1}{A^2} EVM_{VSA_{WN}}^2$$

This equation means that, with inaccurate attenuation estimation (e.g., δ not equal to 1), $EVM_{VSA,Wn}$ will mix into the EVM estimation, and then $\overline{EVM_x^2}$, will be biased by δ and increase/decrease with the $EVM_{VSA\_WN}$.

To make an accurate attenuation estimation, the processes described herein sweep the VSA gain to measure the attenuation based on the $EVM_x$ result. Because the $EVM_{VSA,Wn}$ is a function of VSA gain, the estimated $\overline{EVM_x^2}$ can be expressed as follows:

$$\overline{EVM_x^2} = EVM_x^2 + \frac{\delta - 1}{A^2} EVM_{VSA_{WN}}^2(g)$$

If δ is not equal to 1, the estimated $\overline{EVM_x^2}$ will vary with different VSA gain (g) setting.

Figure 6:
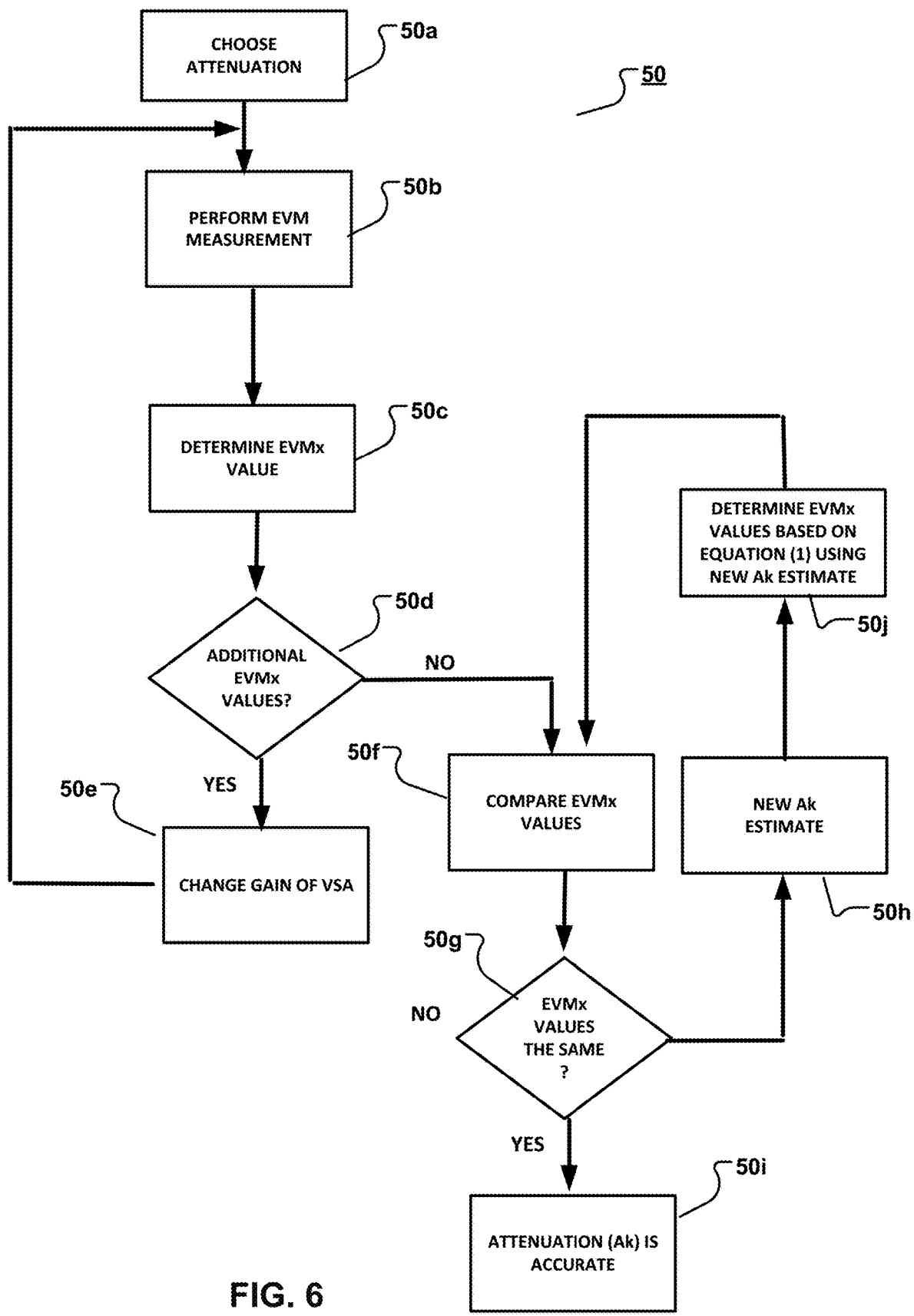
FIG. 6 is a flowchart showing an example process for determining an attenuation in the test channel of the test system.

FIG. 6 shows an example process 50, which may be performed, in part, by control system 25, to estimate one or more values for the attenuation based on varying a gain of the VSA. Process 50 chooses (50a) an attenuation estimation, $A_1$, such as the attenuation setting set in the attenuator by the control system. Process 50 includes causing VSA 22 to perform (50b) a standard EVM measurement for a predefined gain setting in the VSA to obtain an EVM value, e.g., $E[EVM^2]$. The predefined gain may be set in the VSA by the controller. Process 50 determines (50c) an $EVM_x$ value (e.g., $(E[EVM^2])^{1/2}$) according to the techniques described with respect to FIGS. 2 to 5 for the current gain. If additional $EVM_x$ values are needed (50d), processing proceeds to operation (50e), where EVM and $EVM_x$ values are obtained for the new gain.. In this regard, the number of $EVM_x$ values needed for process 50 may be set by the control system and may be based on the number of gain values that are to be tested using the VSA. More gain values may produce more accurate results; the number of gain values to be used my be determined empirically. Process 50 changes (50e) the gain of the VSA. For example, process 50 may increase or decrease the gain by 1%, 2%, 3%, 4%, 5%, 10%, and so forth. Process 50 determines an EVM value, e.g.: $E[EVM^2]$ (50b) and an $EVM_x$ value (e.g., $(E[EVMx^2])^{1/2}$) (50c) according to the techniques described with respect to FIGS. 2 to 5 for the new gain. Operations 50c to 50e may be repeated for multiple gain values within a range of gains, which may be set by the control system. Each increase or decrease in VSA gain may be the same or different.

After operations 50c to 50e have been repeated a requisite number of times, the resulting $EVM_x$ values are compared (50f) to each other. If the $EVM_x$ values are all the same (50g), or within a predefined acceptable range of each other, such as within 1%, 2%, 3%, 4%, or 5%, of each other, process 50 deems (50i) the attenuation to be the actual attenuation. If, however, two or more of the $EVM_x$ values differ, or are not within a predefined acceptable range of each other, a new attenuation estimate, $A_k$, is applied (50h) and processing proceeds according to equation (1) above to calculate new $EVM_x$ values (50j) for the new $A_k$ using the previously measured EVM values $E[EVM^2]$ for the different gains and the corresponding $E[EVM^2_{VSA,WN}]$ values. The resulting calculated $EVM_x$ values are compared (50f) to each other. If the $EVM_x$ values are all the same (50g), or within a predefined acceptable range of each other, such as within 1%, 2%, 3%, 4%, or 5%, of each other, process 50 deems (50i) the new attenuation estimate, $A_k$, to be the actual attenuation. If, however, two or more of the $EVM_x$ values differ, or are not within a predefined acceptable range of each other, operations 50g, 50h, 50j, and 50f are repeated for a next new/estimated value $A_k$. For example, if $EVM_x$ decreases with VSA gain, $A_{k+1}$ may be set to $A_k$/step_scale, where step_scale is the step size of the stepped attenuator. If $EVM_x$ increases with VSA gain, $A_{k+1}$ may be set to $A_k$*step_scale. Process 50 may continue until an accurate value of attenuation is determined (50i). If no values of attenuation meets the criteria set forth above, a value of attenuation that most closely meets the criteria may be selected as the actual value.

The processes described herein also may be used to address a phase noise contribution of the VSA to an EVM measurement. In this regard, VSA phase noise scales with received signal power, not the VSA gain. So the VSA phase noise will contribute to $EVM_x$ determined using the techniques described with respect to FIGS. 2 to 5. Accordingly, the processes described below may be implemented to compensate for the effect of phase noise in $EVM_x$ by estimating the EVM contribution from phase noise of the VSA and removing the EVM contribution from phase noise from $EVM_x$.

Figure 7:
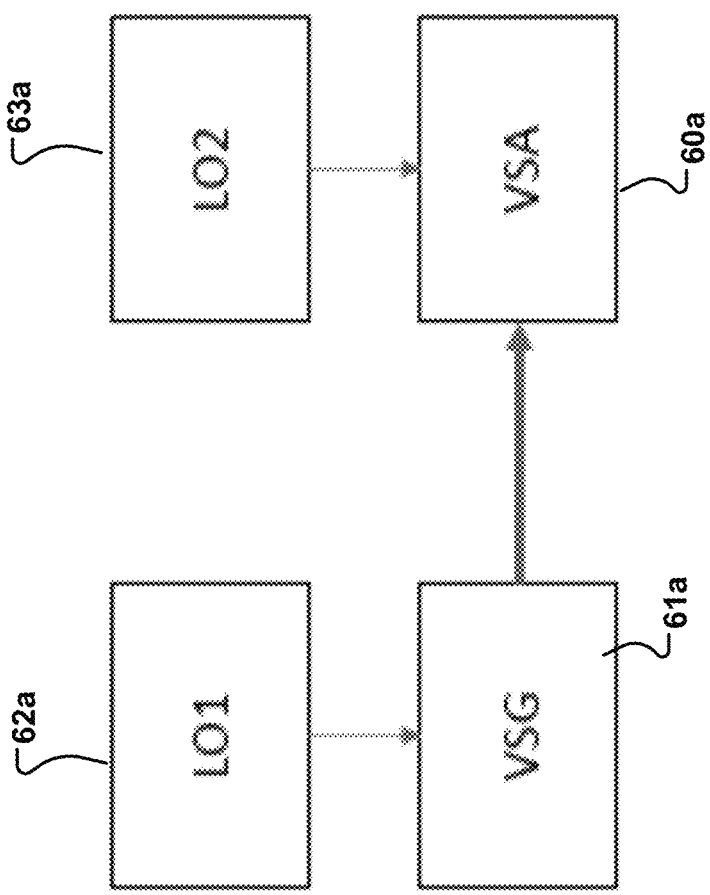
FIG. 7 is a block diagram showing a vector signal analyzer and a vector signal generator operating using independent local oscillators.
Figure 8:
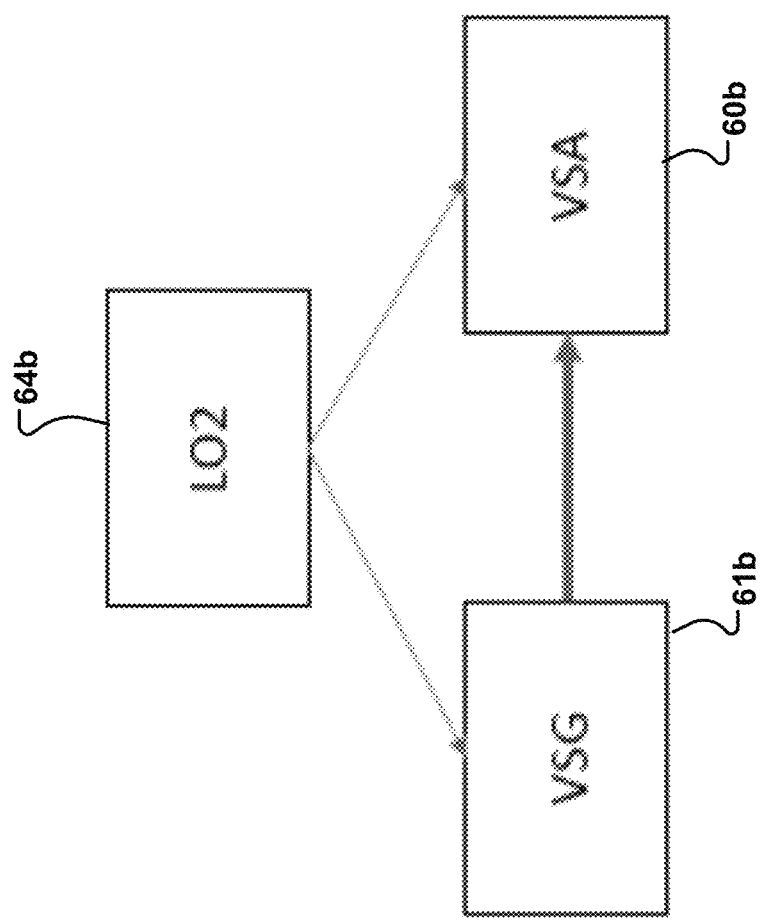
FIG. 8 is a block diagram showing a vector signal analyzer and a vector signal generator operating using a common local oscillator.

Referring to FIGS. 7 and 8, VSAs 60a and 60b, which each may be the same as VSA 22 of FIG. 2, receive and analyze (e.g., measures EVM for) a signal from a respective vector signal generator (VSG) 61a and 61b. In the configuration of FIG. 7, VSG 61a and VSA 60a operate using independent LOs 62a and 63a, respectively, which may have similar performance but are not correlated. In the configuration of FIG. 8, VSG 61b and VSA 60b operate using the same LO 64b. VSA 60a may be the same as VSA 60b or VSA 60a may be different from VSA 60b. In the case where the VSAs are the same, they may have the same configuration and performance. VSG 61a may be the same as VSG 61b or VSG 61a may be different from VSG 61b. In the case where the VSGs are the same, they may have the same configuration and performance. LO 64b may be the same as LO 62a or LO 63a, or LO 64b may be the different from LO 62a or LO 63a. In the case where the LO 64b is the same as LO 62a or LO 63a, the two LOs that are the same may have the same configuration and performance.

Figure 9:
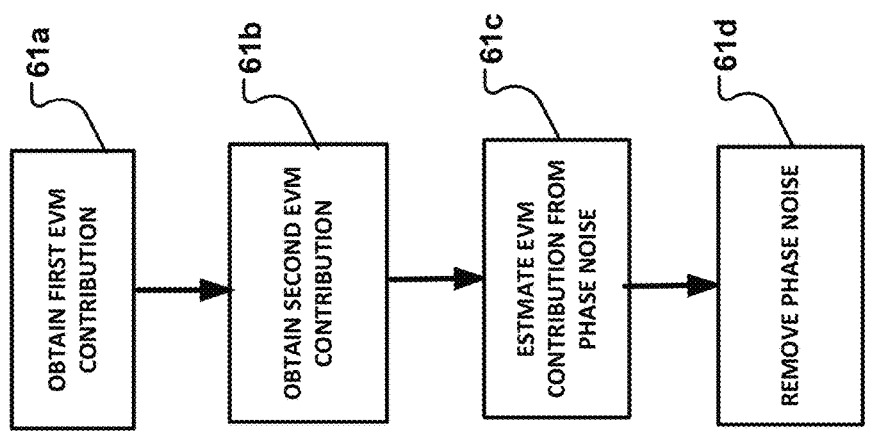
FIG. 9 is a flowchart showing an example process for determining and for removing phase noise from an error vector magnitude measurement.

FIG. 9 shows an example process 61 for estimating the VSA phase noise contribution to EVM using the configurations of FIGS. 7 and 8. Process 61 obtains (61a) a first EVM contribution ($EVM_x$) from phase noise based on measurements obtained using VSA 60a and VSG 61a having independent and uncorrelated local oscillators 62a, 63a. Specifically, the first $EVM_x$ contribution obtained using the configuration of FIG. 7 may be represented as follows:

$$E[EVM_x^2] = E[EVM_{VSG_{WN}}^2] + E[EVM_{VSG_{PN}}^2] + E[EVM_{VSA_{PN}}^2]$$

where $EVM_{VSG\_WN}$ is the white noise contribution to the EVM of the VSG, $EVM_{VSG\_PN}$ is the phase noise contribution to the EVM of the VSG, and $EVM_{VSA\_PA}$ is the phase noise contribution to the EVM of the VSA.

Process 61 obtains (61b) a second EVM contribution ($EVM_x$) from phase noise based on measurements obtained from VSA 60b having a local oscillator 64b (SLO) in common with VSG 61b. The second $EVM_{x,SLO}$ contribution obtained using the configuration of FIG. 8 may be represented as follows:

$$E[EVM_{x,SLO}^2] = E[EVM_{VSG_{WN}}^2]$$

wherein $EVM_{VSG\_WN}$ is the white noise contribution to the EVM of the VSG.

Process 61 includes estimating (61c) the EVM contribution from phase noise based on a difference between the first EVM contribution and the second EVM contribution. More specifically, combining the first and second $EVM_x$ results, and knowing that the phase noise contribution is the same from the VSG and the VSA with the similar-performance LO of FIG. 8, the VSA phase noise contribution may be represented as follows:

$$E[EVM_{VSA_{PN}}^2] = \frac{1}{2}\left(E[EVM_x^2] - E[EVM_{x,SLO}^2]\right)$$

The phase noise contribution, $EVM^2_{VSA\_PN}$, may be determined mathematically from the above expectation value $E[EVM^2_{VSA\_PN}]$ by the control system. The phase noise contribution may be removed (61d) from the $EVM_x$ obtained using the techniques described with respect to FIGS. 2 to 5. For example, the control system may perform various operations essentially to subtract the phase noise from $EVM_x$ obtained according to the processes described with respect to FIGS. 2 to 5.

All or part of the systems and processes described in this specification and their various modifications may be configured or controlled at least in part by one or more computers such as control system 25 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A method of determining a first error vector magnitude (EVM) of a signal output by a device under test (DUT), the method comprising:
   adding attenuation on a signal path between the DUT and a vector signal analyzer (VSA), the attenuation being changeable;
   measuring, at the VSA, at least two second EVMs for different values of attenuation of the signal output by the DUT, the at least two second EVMs being corrupted by noise from the VSA, where each of the at least two second EVMs is based on two or more measurements; and
   determining the first EVM based on a linear relationship that is based on the first EVM, the at least two second EVMs, and a function based on the attenuation, the first EVM being without at least some of the noise from the VSA.

2. The method of claim 1, further comprising:
   determining the noise from the VSA based on a slope of a line fit to the at least two second EVMs.

3. The method of claim 2, further comprising:
   keeping an output signal from the DUT constant while changing the attenuation using an attenuator to produce an input signal to the VSA;
   wherein, for each different value of the attenuation, the method further comprises:
      measuring, at the VSA, one or more additional second EVMs, where each of the one or more additional second EVMs is based on two or more measurements; and
      determining the first EVM based on a linear relationship that is based on the first EVM, the at least two second EVMs and the one or more additional second EVMs, and the function based on the attenuation.

4. The method of claim 1, further comprising varying a reference level signal to the VSA corresponding to a maximum signal that the VSA can handle without introducing significant distortion into the signal output by the DUT; and
   repeating adding, measuring, and determining for each variation of the reference signal to produce a different first EVM.

5. The method of claim 1, wherein the linear relationship comprises an intersection of a line passing through values based on the at least two second EVMs and a zero value of the function based on attenuation.

6. The method of claim 1, wherein the linear relationship comprises a slope of a line passing through values based on the at least two second EVMs; and
   wherein determining comprises extrapolating the line based on the slope to a zero value of the function based on attenuation, the function based on attenuation comprising an inverse of a square of the attenuation.

7. The method of claim 1, wherein compression distortion is a function of gain in the VSA; and
   wherein the method further comprises reducing a gain of the VSA to reduce added distortion in the first EVM.

8. The method of claim 1, wherein an optimized first EVM is determined at a VSA gain that substantially removes compression distortion from the VSA.

9. The method of claim 1, wherein, by reducing VSA gain, a compression distortion contribution of the VSA to the first EVM is reduced.

10. The method of claim 1, further comprising:
    obtaining a value for the attenuation based on varying a gain of the VSA.

11. The method of claim 10, wherein obtaining the value for the attenuation comprises:
    obtaining EVM measurements based on different gain settings of the VSA corresponding to different noise contributions of the VSA and different attenuation values; and
    identifying, based on the EVM measurements, one of the attenuation values where the EVM measurements are substantially same.

12. The method of claim 11, wherein if the EVM measurements do not change, the one of the attenuation values is an actual attenuation in a test channel.

13. The method of claim 11, wherein if an EVM measurement decreases in response to a change in an attenuation value, then a value of the attenuation is decreased to obtain additional EVM measurements; and
    wherein if an EVM increases in response to a change in an attenuation value, then the value of the attenuation is increased to obtain additional EVM measurements.

14. The method of claim 1, wherein the method is performed on automatic test equipment (ATE) comprising at least one processing device and memory to store instructions that are executable by the at least one processing device, the VSA being part of the ATE.

15. The method of claim 14, wherein the method is performed using an attenuator between the ATE and the DUT.

16. The method of claim 14, wherein the method is performed using an attenuator that is part of the ATE.

17. A system for determining a first error vector magnitude (EVM) of a signal output by a device under test (DUT), the system comprising:
- a vector signal analyzer (VSA);
- attenuation circuitry to add attenuation on a signal path between the DUT and the VSA, the attenuation being changeable; and
- one or more processing devices configured to perform operations comprising:
    - obtaining, from the VSA, measurements of at least two second EVMs for different values of attenuation of the signal output by the DUT, the at least two second EVMs being corrupted by noise from the VSA, where each of the at least two second EVMs is based on two or more measurements; and
    - determining the first EVM based on a linear relationship that is based on the first EVM, the at least two second EVMs, and a function based on the attenuation, the first EVM being without at least some of the noise from the VSA.

* * * * *